United States Patent [19]

Fujita et al.

[11] Patent Number: 4,644,349

[45] Date of Patent: Feb. 17, 1987

[54] CONTROL UNIT INCLUDING A CIRCUIT FOR CONTROLLING AND SETTING CONTROL DATA FOR A DIGITAL PROCESSING CIRCUIT OF A COLOR TELEVISION RECEIVER

[75] Inventors: Masaaki Fujita, Takatsuki; Mikio Sasaki, Ibaraki; Teruo Goto; Namio Yamaguchi, both of Hirakata, all of Japan

[73] Assignee: Matsushita Electric Industrial Co., Ltd., Osaka, Japan

[21] Appl. No.: 642,263

[22] Filed: Aug. 20, 1984

[30] Foreign Application Priority Data

Aug. 25, 1983 [JP] Japan ................................ 58-155468
Jun. 4, 1984 [JP] Japan ................................ 59-114977
Jul. 19, 1984 [JP] Japan ................................ 59-149985

[51] Int. Cl.[4] .......................... H04Q 7/00; H04B 1/16
[52] U.S. Cl. .......................... 340/825.25; 358/194.1; 455/186; 340/825.56
[58] Field of Search ............ 340/825.25, 825.56, 340/825.69; 455/166, 182, 186; 358/168, 169, 194.1

[56] References Cited

U.S. PATENT DOCUMENTS

| | | | |
|---|---|---|---|
| 4,306,309 | 12/1981 | Yasuda | 455/186 |
| 4,313,213 | 1/1982 | Farina et al. | 455/186 |
| 4,355,415 | 10/1982 | George et al. | 455/186 |
| 4,398,193 | 8/1983 | Kuniyoshi et al. | 455/186 |
| 4,408,349 | 10/1983 | Yukawa | 455/186 |
| 4,442,413 | 4/1984 | Hayashida et al. | 455/182 |

Primary Examiner—Donald J. Yusko
Attorney, Agent, or Firm—Spencer & Frank

[57] ABSTRACT

Major adjustments of an equipment such as a television receiver are attained by remote control signals from a remote control signal transmitter provided for the equipment. A memory for storing control data for a signal processing circuit, a control circuit for controlling the signal processing circuit and the memory, and a switching circuit for setting the control circuit in a first mode or a second mode are provided. In the first mode, the signal processing circuit is controlled by the remote control signal, and in the second mode, the signal processing circuit is controlled by the same remote control signal and the resulting control data is written into the memory.

2 Claims, 7 Drawing Figures

F I G. 3
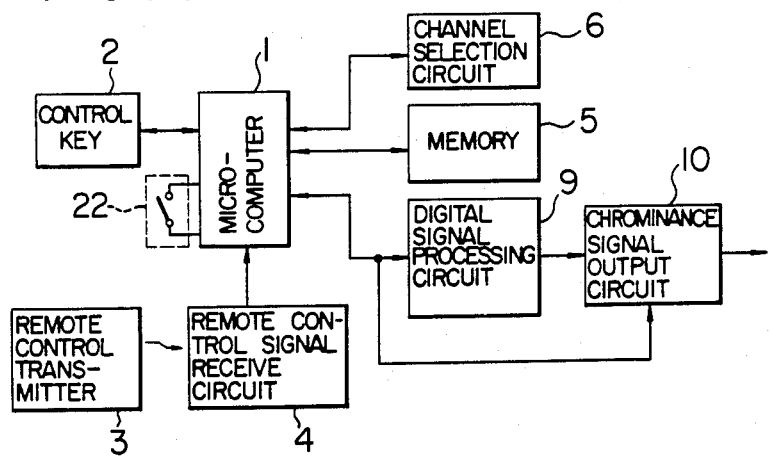

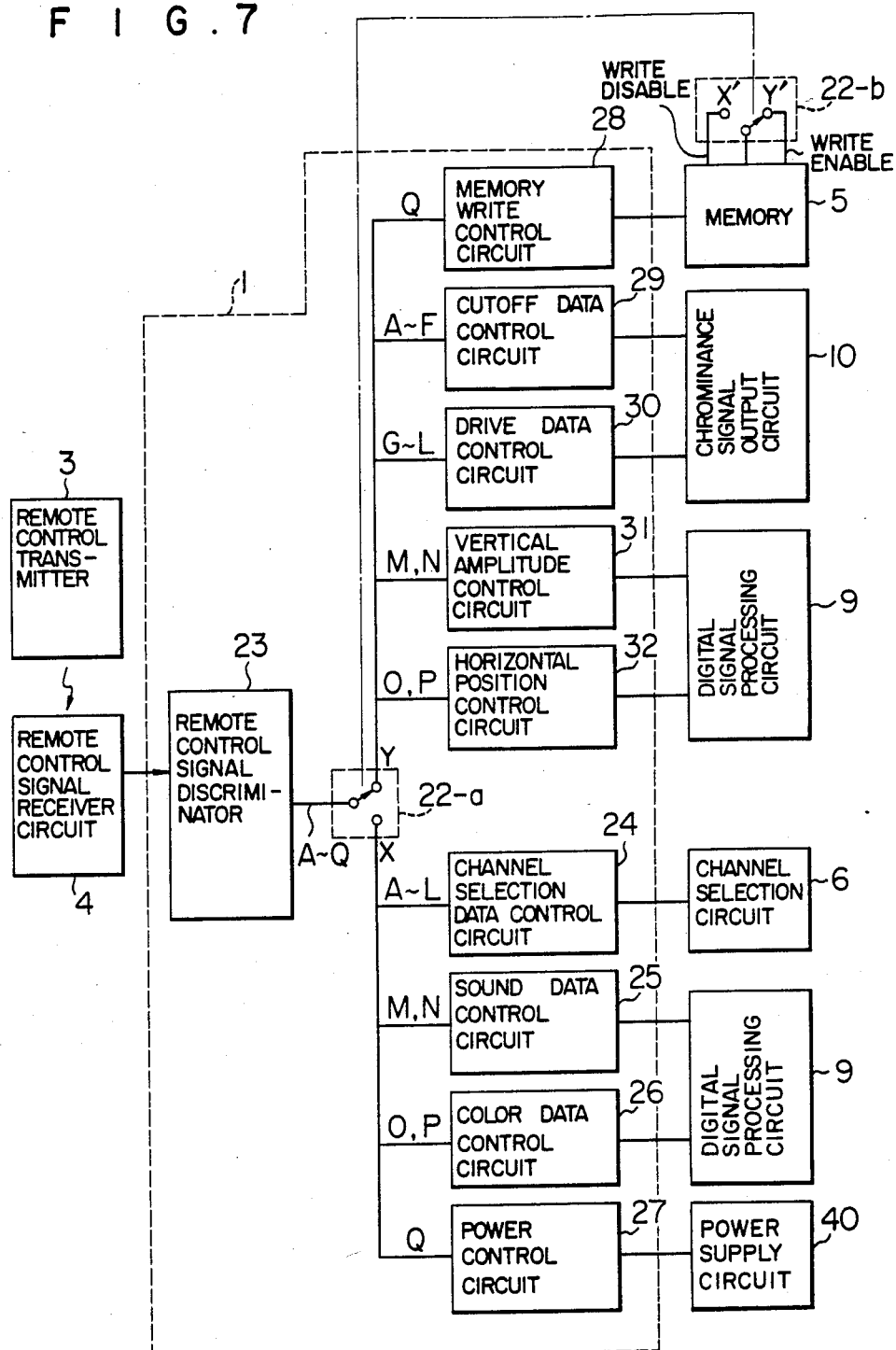

CONTROL UNIT INCLUDING A CIRCUIT FOR CONTROLLING AND SETTING CONTROL DATA FOR A DIGITAL PROCESSING CIRCUIT OF A COLOR TELEVISION RECEIVER

BACKGROUND OF THE INVENTION

The present invention relates to a control unit usable in a color television receiver having a circuit for transmitting and receiving a remote control signal to control a signal processing circuit and a channel selection circuit.

In a recent color television receiver, a microcomputer or a digital signal processing circuit is used so that the television signal is processed or controlled by digital data. When the signal is processed in an digital form, it is necessary to store an initial data because necessary signals are detected from the normally operating color television receiver with reference to the initial data and the detected signals and the initial data are compared in a control microcomputer to assure that the color television is always operated correctly. One example is an automatic white balance adjustment. As automatic white balance adjusting means, a low voltage source and a high voltage source are provided for each of the red, green and blue colors. The reference primary color voltages from the low and high voltage sources are applied as inputs to a chrominance output circuit of the color television receiver to which all adjustments including the white balance have been completed. The beam currents are detected as voltages, which are converted to digital signals, which in turn are stored in a memory as the initial reference data. This is done for each of the red, green and blue colors. During the normal operation of the color television receiver, the low and high voltages for the respective colors are applied to the chrominance signal output circuit in a blanking period and the beam current for one of the primary colors is compared with the initial reference data to detect a deviation of the white balance, and based on the deviation, the DC level and the gain of the chrominance signal are controlled such that the beam currents for other primary colors match the stored three-primary color ratio. The present invention relates to means for adjusting such initial reference data.

On the other hand, in a color television receiver which uses a digital signal processing circuit, if the initial data need be modified because peripheral parts are replaced due to trouble in a completed television receiver, it is necessary to change the initial data in some manner. In the past, the necessary adjustment was done by using an adjusting jig.

The configuration of a conventional digital color television receiver is explained with reference to FIG. 1 in which numeral 1 denotes a control microcomputer, numeral 2 denotes control keys for turning on and off a power supply, selecting a channel and controlling the sound level, numeral 3 denotes a remote control transmitter, numeral 4 denotes a receiver circuit for receiving a remote control signal from the remote control transmitter, numeral 5 denotes a memory, numeral 6 denotes a channel selection circuit, numeral 7 denotes a tuner, numeral 8 denotes an intermediate frequency amplifier, numeral 9 denotes a digital signal processing circuit, numeral 10 denotes a chrominance signal output circuit, numeral 11 denotes a drive circuit, numeral 12 denotes a cathode ray tube, numeral 13 denotes an audio output circuit and numeral 14 denotes a sound output device.

The basic operation of FIG. 1 is explained below. The control microcomputer 1 discriminates the manipulation by the control keys 2 or the remote control transmitter 3 and controls the memory 5, the channel selection circuit 6 and the digital signal processing circuit 9. The channel selection data and the signal processing initial data have been stored in the memory 5, and they are read and written as required. The memory 5 may be a non-volatile memory such as an MNOS memory or a FAMOS memory, or a volatile memory backed up by a battery.

As the channel is selected by the control key 2 or the remote control transmitter 3, the control microcomputer 1 and the channel selection circuit 6 are operated to read out the channel selection data from the memory 5 and apply a tuning voltage corresponding to the channel selection data to the tuner 7. The television signal selected by the tuner 7 is converted to video/audio signal through the audio intermediate frequency amplifier/detector 8, and the signal is applied to the digital signal processing circuit 9. The digital signal processing circuit 9 converts the signal from the intermediate frequency amplifier/detector 8 to a digital signal by an analog/digital converter (not shown), processes the video/audio signal, controls various operations in accordance with instructions from the control microcomputer 1, then converts the signal to an analog signal by a digital/analog converter (not shown), and supplies a chrominance signal to the chrominance signal output circuit 10 through a line 16. The chrominance signal output circuit 10 adjusts the DC level and the gain of the chrominance signal by the digital data supplied from the control microcomputer 1 through a line 15. The digital data is converted to analog data by the digital-/analog converter and the converted analog data is supplied to the chrominance signal output circuit 10. The chrominance signal adjusted by the chrominance signal output circuit 10 is applied to the drive circuit 11 which drives the CRT 12. On the other hand, the audio signal is applied to the audio output circuit 13 through a line 17 to drive the sound output device 14.

In the digital television receiver, almost all adjustments are done in accordance with the digital data from the control microcomputer 1 as explained above in connection with the operation of the chrominance signal output circuit 10. Accordingly, the externally adjustable parts such as volume controllers or trimmer capacitors used in the prior art analog television receiver tend to be eliminated.

In the adjustment of such digital television receiver, a special adjusting jig as shown in FIG. 2 has been used in the past. FIG. 2 illustrates an example of the adjusting method for the digital television receiver. The like numerals to those shown in FIG. 2 denote the blocks having the like functions. Only those blocks which are necessary for the explanation are extracted. In FIG. 2 numeral 18 denotes an adjusting jig and numeral 19 denotes a signal switch for a normal mode and an adjustment mode. The operation of the adjusting device is explained below.

In the normal mode, the signal switch 19 is connected to a terminal X, and a control line 20 for the memory 5 and a control line 21 for the digital signal processing circuit 9 and the chrominance signal output circuit 10 are connected to the control microcomputer 1. In the adjustment mode, the signal switch 19 is connected to a terminal Y. Thus, the control line 20 for the memory 5 and the control line 21 for the digital signal processing circuit 9 and the chrominance signal output circuit 10 are connected to the adjusting jig 18. In the adjustment mode, the adjusting jig 18 sends digital data to the digital signal processing circuit 9 and the chrominance signal output circuit 10 through the control line 21 to effect necessary adjustments. After the adjustment, the adjusting jig 18 writes the adjusted digital data into the memory 5 through the control line 20. In this manner, the adjustment is carried out.

In the above arrangement, a special adjusting jig is required for the adjustment. Even for a simple adjustment for the field replacement of a part, the control line must be switched and the adjusting jig must be provided. This is time consuming.

SUMMARY OF THE INVENTION

It is an object of the present invention to provide a control unit which can effect major adjustments by a remote control signal from a remote control signal transmitter of a television receiver, without requiring a special adjusting jig.

It is another object of the present invention to provide a control unit which allows updating of the memory content only in an adjustment mode to protect the content of the memory.

The control unit of the present invention comprises a signal processing circuit, a memory for storing control data for determining the operating conditions of the signal processing circuit, a control circuit for controlling the signal processing circuit and the memory, a switching circuit for setting the control circuit in a first mode or a second mode, and an operating section for controlling the signal processing circuit through the control circuit. In the first mode, the signal processing circuit is controlled by the remote control signal, and in the second mode, the control data for the signal processing circuit is adjusted by the same remote control signal and the adjusted control data is written into the memory. Because the adjustment is done by the remote control signal, no adjusting jig is required and the signal processing circuit can be readily adjusted.

BRIEF DESCRIPTION OF THE DRAWINGS

The present invention will be apparent from the following detailed description taken in conjunction with the accompanying drawings, in which:

FIG. 3 is a block diagram of a configuration of a control unit in accordance with one embodiment of the present invention;

FIG. 7 is a block diagram of a configuration of another embodiment of the control unit of the present invention.

DESCRIPTION OF THE PREFERRED EMBODIMENTS

Figure 1:
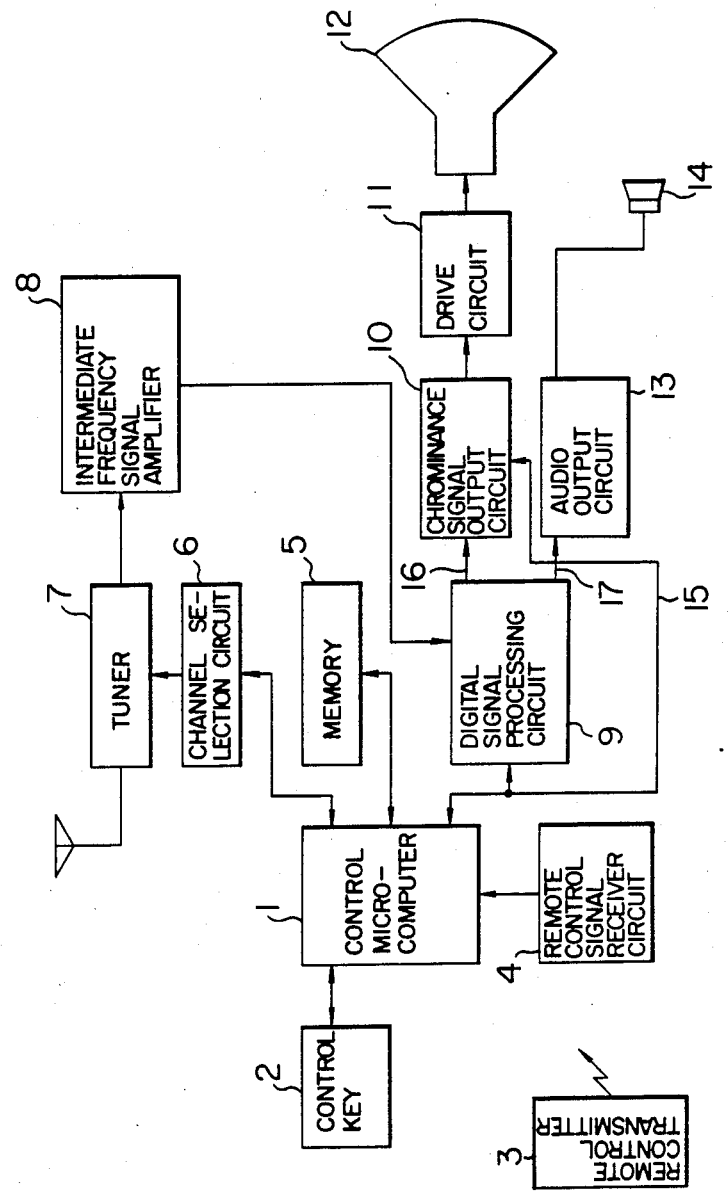
FIG. 1 is a block diagram of a basic configuration of a television receiver having a digital signal processing circuit.
Figure 2:
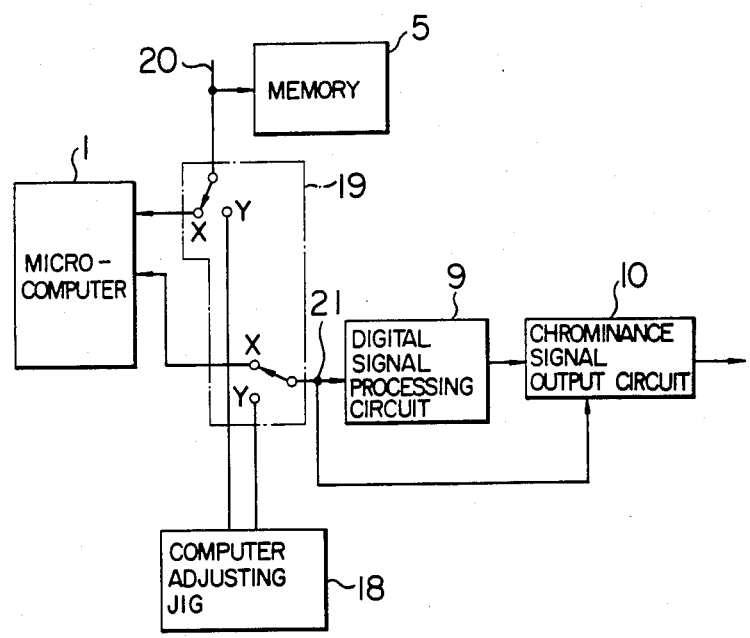
FIG. 2 is a block diagram of main portions of a prior art adjusting device for the digital signal processing circuit.

One embodiment of the present invention is now explained. FIG. 3 shows one embodiment of the control unit of the present invention. The control microcomputer 1, the control key 2, the remote control transmitter 3, the remote control signal receiver circuit 4, the memory 5, the channel selection circuit 6, the tuner 7, the intermediate frequency amplifier/detector 8, the digital signal processing circuit 9, the chrominance signal output circuit 10, the drive circuit 11, the CRT 12, the audio output circuit 13 and the sound output device 14 have the same functions as those shown in FIG. 1. Numeral 22 denotes a switch which selects a normal mode or an adjustment mode.

Figure 4:
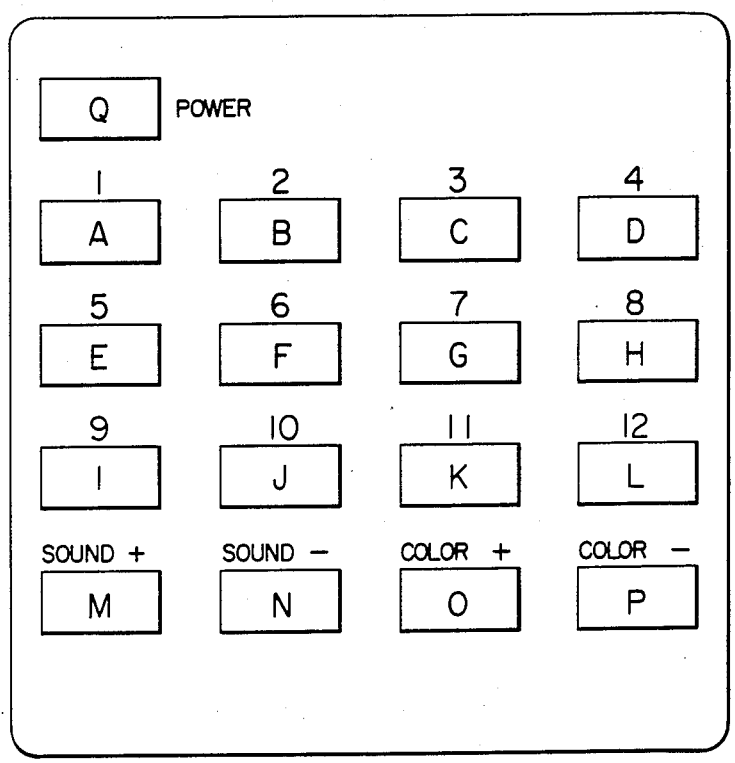
FIG. 4 is a front view of a control panel of a remote control signal transmitter in a normal mode.

The normal mode is a television receiver watching mode, an example of a control panel of the remote control transmitter 3 in this mode is shown in FIG. 4. Letters A-Q in rectangular frames (which represent keys) bn FIG. 4 represent types of remote control signal codes. They are designated for the purpose of explanation. For example, in the normal mode, the keys A-L are used as channel selection keys. By depressing one of the channel selection keys A-L, the channel selection circuit 6 is controlled to select the desired channel. M and N denote keys for controlling a sound level, O and P denote keys for controlling a color density and Q denotes a power key. By depressing the keys M-Q, the digital signal processing circuit 9 and the power supply circuit 40 are controlled through the control microcomputer 1.

Figure 5:
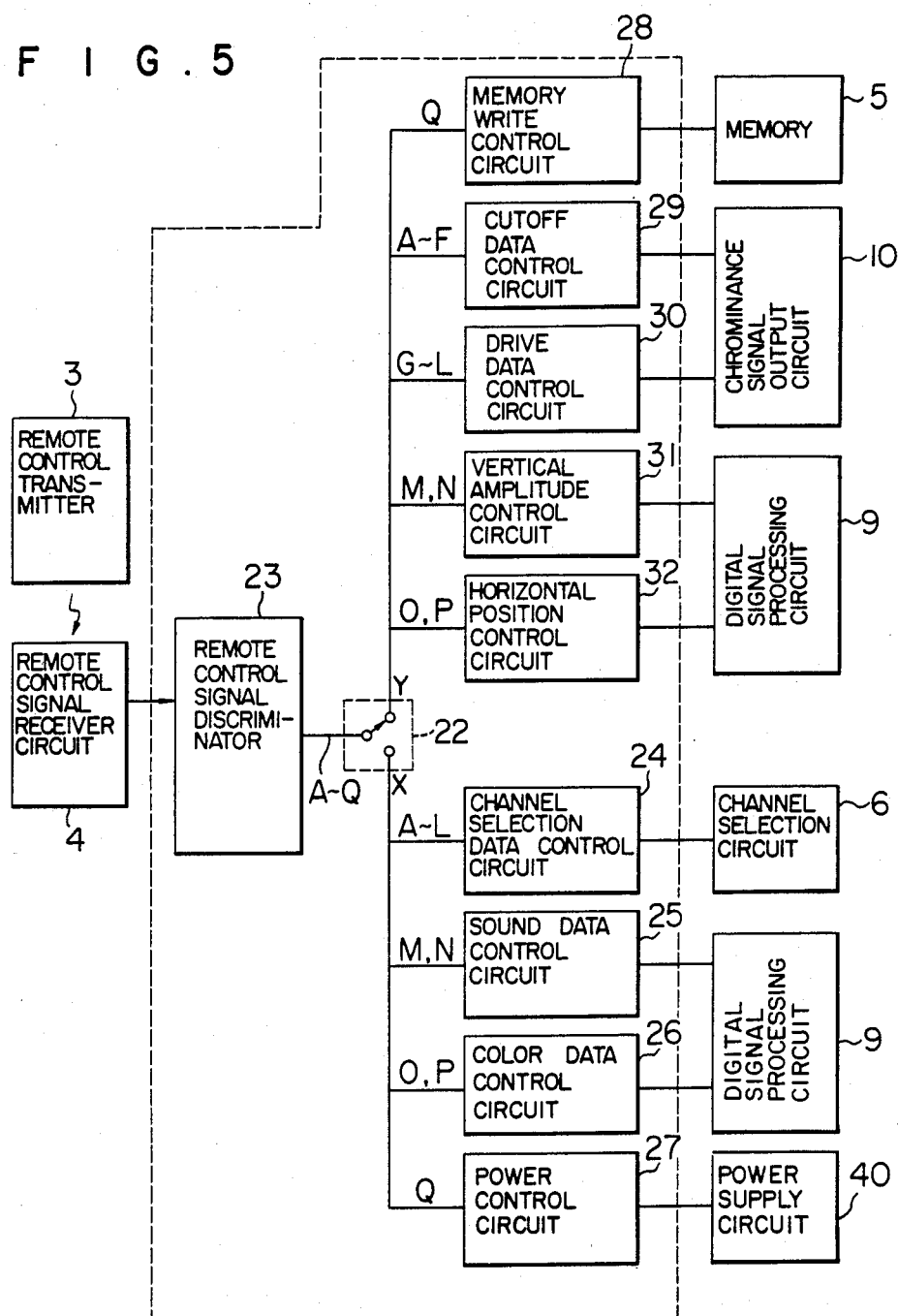
FIG. 5 is a block diagram of functions of the control unit in one embodiment of the present invention.

The operations in the normal mode and the adjustment mode are further explained with reference to FIG. 5. FIG. 5 is a functional block representation of the major units of FIG. 3. In FIG. 5, when the switching circuit 22 is connected to the terminal X, the normal mode is selected, and when the switching circuit 22 is connected to the terminal Y, the adjustment mode is selected. The cutoff level of the CRT 12, the drive level of the chrominance signal and the video vertical and horizontal amplitudes can be adjusted by the remote control signals from the remote control transmitter 3.

In FIG. 5, numeral 23 denotes discrimination means for discriminating the remote control signal, which is one of the functions of the control microcomputer 1, numeral 24 denotes means for controlling the channel selection circuit 6 in response to the channel selection data A-L of the remote control signal, numeral 25 denotes means for controlling the sound level data in response to the remote control signal M or N, numeral 26 denotes means for controlling the color density data in response to the remote control signal O or P, numeral 27 denotes means for turning on or off the power supply circuit 40 in response to the remote control signal Q, numeral 28 denotes means for controlling writing of the data into the memory 5 in response to the remote control signal Q, numeral 29 denotes means for controlling the cutoff data for the chrominance signal output circuit 10 in response to the remote control signals A-F, numeral 30 denotes means for controlling the drive data for the chrominance signal output circuit 10 in response to the remote control signals G-L, numeral 31 denotes means for controlling the vertical amplitude data in response to the remote control signals M and N, and numeral 32 denotes means for controlling the horizontal position data in response to the remote control signals O and P. The remote control signals A-Q correspond to the codes shown in FIG. 4 as the example of the remote control transmitter. The sound level, the color density, the vertical amplitude and the horizontal position are controlled by sending the control data from the control microcomputer 1 to the digital signal processing circuit 9.

The operation of FIG. 5 is now explained. The control command (pulse code signal) transmitted from the remote control transmitter 3 is applied to the remote control signal discrimination means 23 through the remote control signal receiver 4. The remote control signal discrimination means 23 discriminates the remote control signals A–Q and sends them to the corresponding control means. When the switching circuit 22 is connected to the terminal X, the normal mode is selected and the remote control signals A–L are applied to the channel selection data control means 24 to drive the channel selection circuit 6. The remote control signals M and N are applied to the sound level control means 25 so that the sound level is controlled by the digital signal processing circuit 9. The remote control signals O–P are applied to the color density control means 26 so that the color density is controlled by the digital signal processing circuit 9. The remote control signal Q is applied to the power supply on/off means 27 to control the turn-on and the turn-off of the power supply circuit 40. This is the operation for the normal television watching mode.

When the switching circuit 22 is connected to the terminal Y, the adjustment mode is selected and the remote control signals A–Q are applied to the control means 28–32.

The signals A–F are applied to the cutoff data control means 29 to control the cutoff of the chrominance signal output circuit 10. The remote control signals G–L are applied to the drive data control means 30 to control the drive level (DC level and gain) of the chrominance signal output circuit 10. The remote control signals M and N are applied to the vertical amplitude control means 31 to control the vertical amplitude by the digital signal processing circuit 9. The remote control signals O and P are applied to the horizontal position control means 32 to control the horizontal amplitude by the digital signal processing circuit 9. The remote control signal Q is applied to the memory write control means 28 to write the data adjusted by the remote control signals A–P into the memory 5 as the initial data.

Figure 6:
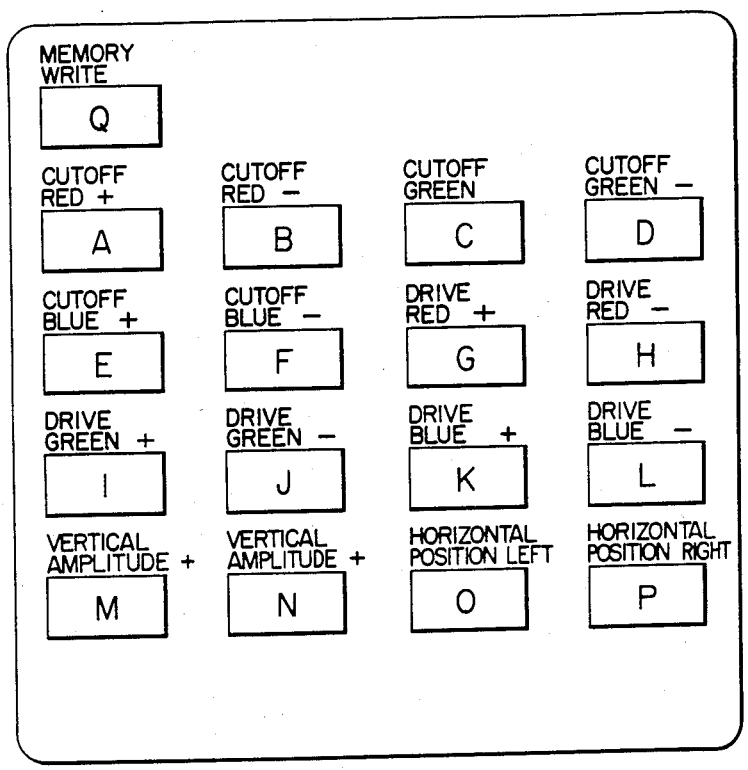
FIG. 6 is a front view of the control panel of the remote control signal transmitter in an adjustment mode.

The control panel of the remote signal transmitter 3 in the adjustment mode is shown in FIG. 6.

The chrominance signal output circuit 10 needs controls for red, green and blue. These colors can be adjusted respectively by the cutoff data level adjusting keys A–F and the drive data level adjusting keys G–L. The vertical amplitude adjusting keys M and N and the horizontal position adjusting keys O and P are also set. The writing of the data into the memory 5 is effected by the key Q. The amount of control can be adjusted by the key depression period. In the present control unit, the same remote control signals may be used to control the television receiver as shown in FIG. 4 when the switching circuit 22 selects the normal mode, and may be used to adjust the main functions of the television receiver and write the adjusted data into the memory 5 in the adjustment mode. Since the present control unit uses the remote control signals for the adjustment, no special jig need be prepared for the adjustment and no wiring is required.

Although the control panel of the transmitter 3 may have characters previously printed thereon corresponding to the respective keys as shown in FIG. 6, it may be without such characters since it serves both for the normal mode and the adjustment mode. Accordingly, it is very convenient to use a panel having characters shown in FIG. 6 printed thereon and apertures corresponding to the keys formed therein may be prepared and it may be placed on the control panel (without the printed characters) of the remote control transmitter 3 in the adjustment mode to facilitate the adjustment.

FIG. 7 shows another embodiment of the present invention. In the embodiment of FIG. 3, if the memory 5 is always writable, when external noise is received, the content of the memory 5 might be erased or changed. The control unit shown in FIG. 7 resolves this problem. In the present embodiment, the memory writing is enabled only in the adjustment mode of the digital signal processing circuit 9 in order to protect the content of the memory 5.

FIG. 7 shows only major portions of the control unit. The blocks designated by the like numerals to those of FIG. 3 have the same functions. Numerals 22-a and 22-b denote switching circuits for selecting the normal mode and the adjustment mode. They are synchronously switched. When the switching circuits 22-a and 22-b are connected to the terminals X and X' respectively, the normal mode is selected. The memory writing is disabled in this mode.

The operation in the normal mode is similar to that of FIG. 3. The sound level, the color density and the channel selection are controlled by the control key 2 or the remote control transmitter 3.

In the adjustment mode, the switching circuits 22-a and 22-b are switched to the terminals Y and Y' respectively. The memory writing is enabled only in this mode. Various adjustments can be done by using the remote control transmitter 3 and the adjusted data can be written into the memory 5.

In the arrangement shown in FIG. 7, the adjustments of the color television receiver are effected by the remote control signal of the remote control transmitter and the writing of the adjusted data is permitted only in the adjustment mode. Accordingly, there is no risk that the content of the memory 5 is disturbed by external noise and correct operation is always attained.

In the above embodiments, the signal processing circuit 9 is of the digital type. The present invention is also applicable to a color television receiver having an analog video signal processing circuit. In the analog processing circuit, since the initial values can be set by potentiometers and trimmer capacitors, it is not necessary to write the initial values into the memory 5. When adjustment is required, the adjustment mode is set by the switching circuit 22 and the control data of the analog signal processing circuit and the chrominance signal output circuit are adjusted and modified by the remote control signals, and the adjusted and modified control data are written into the memory 5. The digital control data are converted to analog data by a digital/analog converter (not shown) and the converted analog data is applied to the analog signal processing circuit and the chrominance signal output circuit. The operation in the normal mode is similar to that of FIG. 3.

We claim:

1. A control unit comprising:

a signal processing circuit for converting a television signal into a digital signal, and for digitally processing the converted signal;

a memory for storing control data including initial values required for the digital signal processing of said signal processing circuit;

a control circuit including a control microcomputer for controlling said signal processing circuit and said memory;

transmitter and receiver circuits for transmitting and receiving respectively at least one remote control signal;

a first switch for setting said control circuit in a first mode or a second mode, said control circuit when set in said first mode controlling the digital processing including sound-volume adjustment of said signal processing circuit in accordance with said at least one remote control signal, and said control circuit when set in said second mode controlling the signal processing of said signal processing circuit to update the control data stored in said memory by adjustably setting said control data in accordance with said at least one remote control signal; and a second switch selectively operable for inhibiting in said first mode the updating of the control data stored in said memory and for allowing in said second mode the updating of the data stored in said memory.

2. A control unit according to claim 1, wherein said first and second switches are interlocked so that said first and second switches are set simultaneously for operation in said first mode or said second mode.

* * * * *